United States Patent [19]

Lin

[11] Patent Number: 5,584,934
[45] Date of Patent: Dec. 17, 1996

[54] METHOD AND APPARATUS FOR PREVENTING DISTORTION OF HORIZONTAL QUARTZ TUBE CAUSED BY HIGH TEMPERATURE

[75] Inventor: Peter Y. Lin, Miau-Li, Taiwan

[73] Assignee: United Microelectronics Corp., Taiwan, Taiwan

[21] Appl. No.: 542,693

[22] Filed: Oct. 13, 1995

[51] Int. Cl.⁶ ........................................... C23C 16/00
[52] U.S. Cl. .................. 118/724; 118/715; 219/390; 432/4; 432/37; 432/95; 432/253
[58] Field of Search ...................... 118/715, 724, 118/725, 50; 219/390, 388; 432/2, 4, 5, 6, 11, 37, 41, 47, 57, 95, 117, 152, 206, 253; 156/345

[56] References Cited

U.S. PATENT DOCUMENTS

| | | | |
|---|---|---|---|
| 4,421,942 | 12/1983 | Crichton | 136/217 |
| 4,711,989 | 12/1987 | Yu | 219/390 |
| 4,854,266 | 8/1989 | Simson | 118/728 |
| 5,029,554 | 7/1991 | Miyashita | 118/715 |
| 5,118,286 | 6/1992 | Sarin | 432/2 |
| 5,254,172 | 10/1993 | Otaki | 118/725 |

*Primary Examiner*—Robert Kunemund
*Assistant Examiner*—Jeffrie R. Lund
*Attorney, Agent, or Firm*—Brumbaugh, Graves, Donohue & Raymond

[57] ABSTRACT

The present invention relates to an improved equipment in semiconductor processing. The invention includes a horizontal quartz tube surrounded with heating element for processing wafers, an inlet pipe of a gas injector mounted at the center of the closed end of a horizontal quartz tube, four sheath supports each being 90 degrees apart located at the closed end of a horizontal quartz tube for supporting a thermocouple sheath. The horizontal quartz tube is rotated 90 degrees every 14 to 15 days in a predetermined direction. As the horizontal quartz tube is rotated, the thermocouple sheath is always inserted into the sheath support located at the bottom of the horizontal quartz tube.

14 Claims, 3 Drawing Sheets

METHOD AND APPARATUS FOR PREVENTING DISTORTION OF HORIZONTAL QUARTZ TUBE CAUSED BY HIGH TEMPERATURE

BACKGROUND OF THE INVENTION

A. Field of the Invention

The invention relates to a method and apparatus for improving semiconductor processing equipment, and more specifically, to a method and apparatus for preventing a horizontal quartz tube located in a furnace module from bending due to high temperature and gravity.

B. Description of the Prior Art

A conventional semiconductor processing equipment includes four parts: source cabinet 11, furnace module 12, load station 13, and controller 14, as shown in FIG. 1. Furnace module 12 contains horizontal quartz tube 101 for processing wafers. The outside wall of horizontal quartz tube 101 is surrounded with heating element 102 for heating wafers inside. Load station 13 is a wafers transfer system which can load wafers 103 into horizontal quartz tube 101. Wafers 103 are placed on top of boat 104 to be delivered by paddle 105 into horizontal quartz tube 101. Source cabinet 11 contains gas piping (not shown in FIG. 1) and a mass flow controller (not shown in FIG. 1). At the closed end of horizontal quartz tube 101, there is an inlet pipe 106 of a gas injector which injects high purity gases into horizontal quartz tube 101 such as, $O_2$, $H_2O$, HCL, TCA, TDCE, and so on. Controller 14 controls the factors of processing wafers such like, temperature, timing, air, and recipe.

FIG. 2A shows the schematic diagram of a conventional horizontal quartz tube. Referring to FIG. 2A, the inlet pipe of gas injector 202 is at the center of the closed end of horizontal quartz tube 201 for injecting high purity gases into horizontal quartz tube 201. At the bottom of horizontal quartz tube 201, there is a removable thermocouple sheath 203 inserted with a thermocouple for temperature measurement. FIG. 2B shows an enlarged detail of the part 205 where thermocouple sheath 203 is adjacent to horizontal quartz tube 201. As FIG. 2B shows, the inlet pipe 206 of thermocouple sheath 203 has a flat opening. The opposite end 207 of thermocouple sheath 203 as illustrated in FIG. 2C is closed so that the thermocouple inside will not be exposed to the air of horizontal quartz tube 201. Thermocouple sheath 203 is weld on horizontal quartz tube 201.

During the heating process, the temperature can reach about 1200° C. Since the melting point of a conventional horizontal quartz tube is about 1300° C., the high temperature and the weight of the horizontal quartz tube itself will cause the horizontal quartz tube to bend about 2 cm in the center in about one month. The distortion of horizontal quartz tube is large enough to break the wafers as the wafers are transferred to the horizontal quartz tube. Consequently, the horizontal quartz tube must be replaced every month. Currently, a horizontal quartz tube costs about $2,700 dollars. Suppose a Fab has nine such horizontal quartz tubes, the total cost for the replacement of horizontal quartz tubes will be as much as $291,600 dollars each year.

In addition to the replacement fee, the efforts and time devoted in replacing such horizontal quartz tubes must also be considered. For one thing, before the horizontal quartz tube can be safely removed, its temperature must be cooled down from 800° C. to room temperature. The cooling procedure takes about 8 hours. Before a new horizontal quartz tube can start working, it needs to be installed that includes temperature adjusting, testing and many other things. So, the labor and time devoted in installing a horizontal quartz tube each time must also be counted. In general, the entire procedure for replacing a horizontal quartz tube takes over 24 hours. For another thing, during this time, all the jobs related to processing wafers in horizontal quartz tubes stay idle until the horizontal quartz tube is replaced. The frequent replacement of horizontal quartz tubes will certainly decrease the production rate of wafers. For these reasons, it is desirable to increase the lifetime of a horizontal quartz tube and minimize the time and effort devoted in replacing horizontal quartz tubes. More importantly, it is desirable to save the replacement fee.

SUMMARY OF THE INVENTION

Accordingly, it is an object of the present invention to provide a method and apparatus for preventing the horizontal quartz tube from bending due to high temperature and gravity.

It is another object of the present invention to provide a method and apparatus for saving the horizontal quartz tube replacement fee.

It is a further object of the present invention to prevent wafers from breaking due to the distortion of a horizontal quartz tube.

Briefly described, the preferred embodiment of the invention encompasses a horizontal quartz tube surrounded with heating element for processing wafers. An inlet pipe of a gas injector mounted at the center of the closed end of the horizontal quartz tube is used to inject high purity gases into the horizontal quartz tube for wafer processing. At the edge of the closed end of the horizontal quartz tube, the invention mounts four sheath supports for allowing a thermocouple sheath inserted inside. The four sheath supports are 90 degrees apart. For temperature measurement, a thermocouple sheath with thermocouple inside is inserted into one of the sheath supports that is located at the bottom of the horizontal quartz tube.

With this implementation, the horizontal quartz tube is rotated 90 degrees every 14 to 15 days and in a predetermined direction which can be clockwise or counter-clockwise. As the horizontal quartz tube is rotated, the sheath supports change its position accordingly and will be inserted with the thermocouple sheath in turn. The thermocouple sheath is always inserted into the sheath support which is at the bottom of the horizontal quartz tube. As observed, when the horizontal quartz tube is rotated in such a fashion, its lifetime can be increased to over 8 months.

BRIEF DESCRIPTION OF THE DRAWINGS

These and other objects and advantages of the invention will become apparent by reference to the following description and accompanying drawings wherein.

DETAILED DESCRIPTION OF THE PREFERRED EMBODIMENTS

Figure 1:
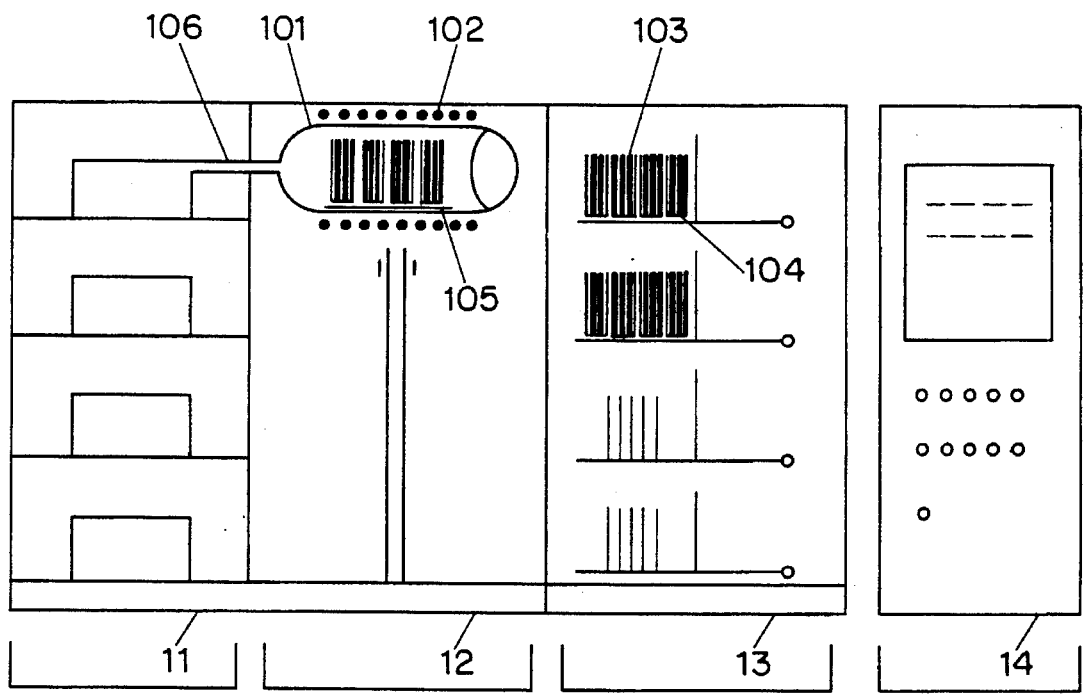
FIG. 1 is a schematic diagram showing a conventional semiconductor processing equipment which contains a horizontal quartz tube for processing wafers.
Figure 2A:
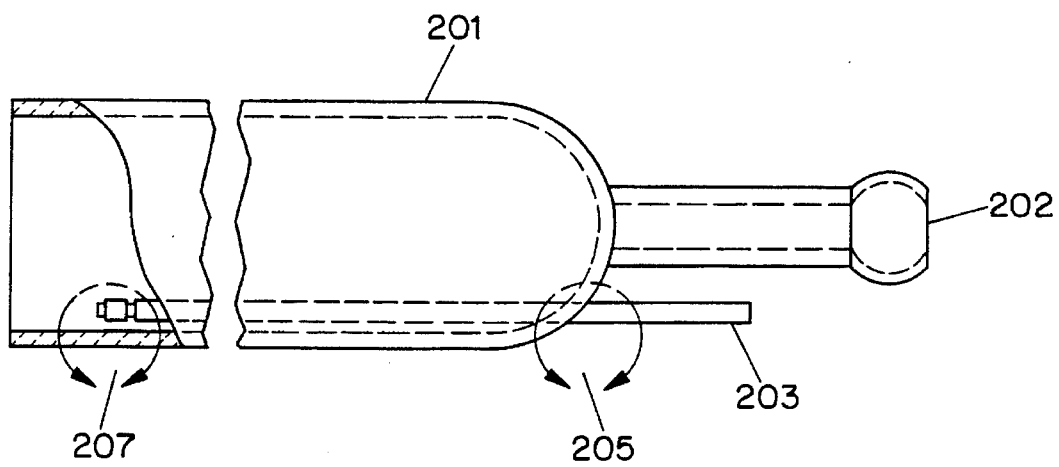
FIG. 2A is a front view showing the outlook of a conventional horizontal quartz tube.
Figure 2B:
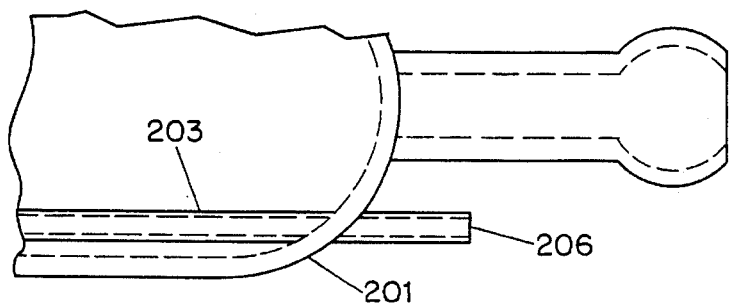
FIG. 2B is an enlarged detail showing the open end of a conventional horizontal quartz tube.
Figure 2C:
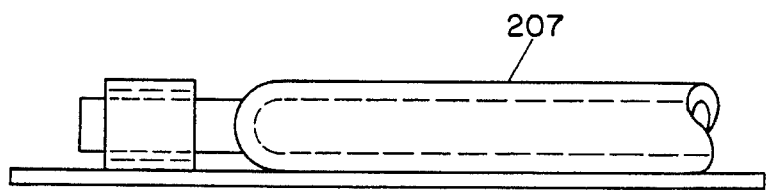
FIG. 2C is an enlarged detail showing the closed end of a conventional thermocouple sheath.
Figures 3A, 3E:
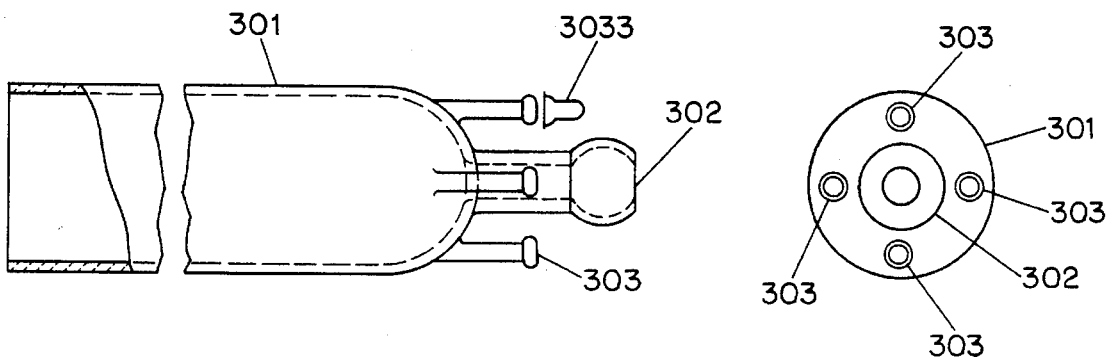
FIG. 3A is a front view showing a preferred embodiment according to the present invention.
FIG. 3E is a side view showing the position of the sheath supports.

To solve the distortion problem of the horizontal quartz tube caused by the high temperature and weight of the horizontal quartz tube itself, the invention makes the following improvements. Referring to FIG. 3A, four sheath supports 303 are mounted at the closed end of horizontal quartz tube 301 around the inlet pipe of gas injector 302. Each sheath support 303 is 90 degrees apart. Thermocouple sheath 307 is inserted into sheath support 303 located at the bottom of horizontal quartz tube 301. The locations of the four sheath supports 303 can be illustrated more clearly in FIG. 3E.

Figure 3B:
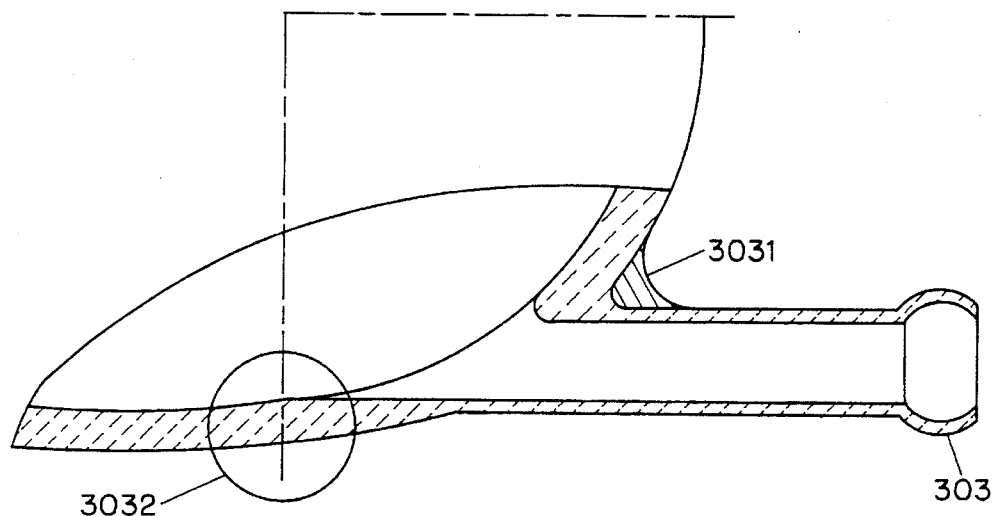
FIG. 3B is an enlarged detail showing a sheath support according to the preferred embodiment of the present invention.

FIG. 3B shows the enlarged detail of sheath support 303. The open end of sheath support 303 has a ball joint which can fasten its matching cover 3033 tightly. Sheath support 303 is made of quartz with the inside diameter around 11.5 mm and outside diameter about 15 mm. In order to enhance the part 3031 where sheath support 303 is adjacent to the outside wall of horizontal quartz tube 301, an enforcement treatment must be made on the weld spots 3031 as shown in FIG. 3B. Moreover, for easy insertion, the contact surface 3032 where the inner wall of horizontal quartz tube 301 is adjacent to sheath support 303 must be made as straight as possible to allow thermocouple sheath 307 be inserted into the passage of sheath support 303 smoothly. Each sheath support 303, except the one inserted with a thermocouple sheath 307, must be covered with a matching cap 3033 when horizontal quartz tube 301 is processing wafers.

Figure 3C:
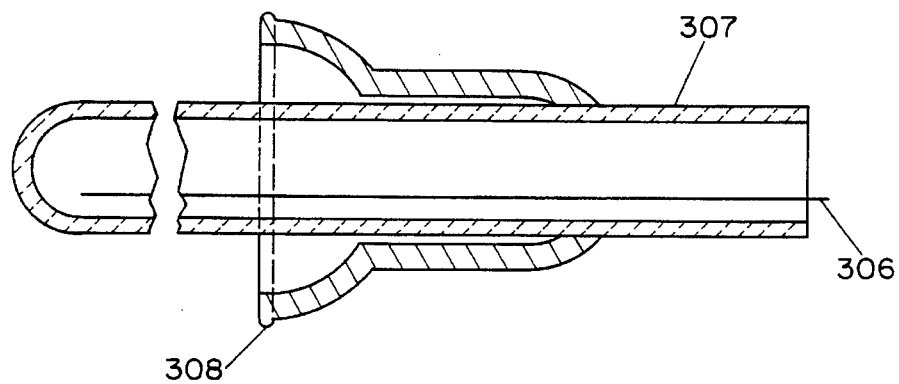
FIG. 3C is an enlarged detail showing a thermocouple sheath according to the preferred embodiment of the present invention.
Figure 3D:
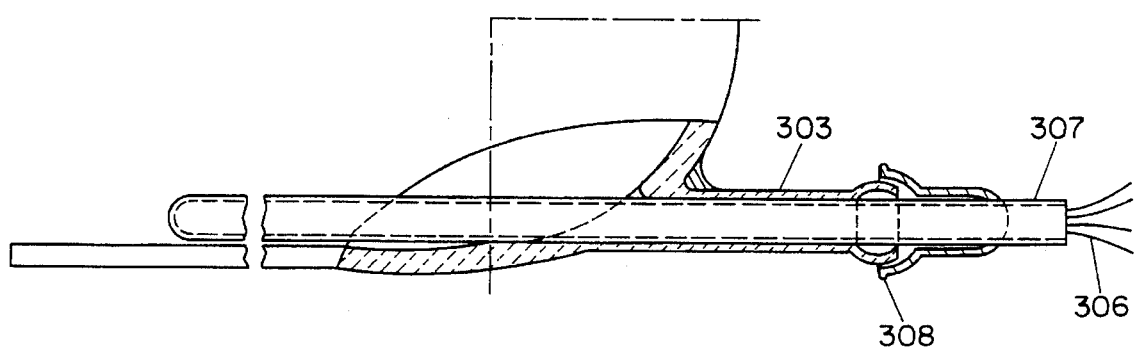
FIG. 3D is a front view showing a sheath support inserted with a thermocouple sheath.

The outlook of thermocouple sheath 307 is shown in FIG. 3C. Thermocouple sheath 307 is inserted with thermocouple 306 for temperature measurement. The inlet pipe of sheath support 303 is connected to a ball joint 308 which can match the ball joint of thermocouple sheath 307. The opposite end of thermocouple sheath 307 is closed so that thermocouple 306 inside will not be exposed to the air in horizontal quartz tube 301. FIG. 3D is a front view showing sheath support 303 is inserted with thermocouple sheath 307.

The advantage of mounting four sheath supports 303 is that horizontal quartz tube 301 can be rotated 90 degrees every 14 to 15 days in a predetermined direction. The predetermined direction can be either clockwise or counterclockwise. Before rotation, the pipe connected to the inlet pipe of gas injector 302 must be removed. Then, rotate sheath support 303 90 degrees in a predetermined direction so that sheath support 303 will be inserted with thermocouple sheath 307 in turn. Rotating the whole horizontal quartz tube 301 is very easy. The wafers transfer system need not be changed. We only need to remove the pipe connected to the inlet pipe of gas injector 302, and then rotate sheath support 303 90 degrees in a predetermined direction. After that, insert thermocouple sheath 307 into the sheath support 303 located at the bottom of horizontal quartz tube 301 and cover other sheath supports 303 with their matching caps.

Because of the periodical rotation, the bending curve of horizontal quartz tube 301 can be adjusted automatically with the aid of gravity. Consequently, horizontal quartz tube 301 can keep working without bending for over 8 months. With the method and implementation of the invention, horizontal quartz tube 301 can function properly until its normal lifetime is due. Even at that time, the distortion of horizontal quartz tube 301 is still under allowable range.

The invention can solve the well-known horizontal quartz tube distortion problem efficiently and then achieve the purposes stated above. In contrast, the distortion problem occurred in a conventional horizontal quartz tube cannot be solved by rotating horizontal quartz tube because thermocouple sheath 203 is also made of quartz. When a conventional thermocouple sheath 203 is placed on any position other than the bottom of horizontal quartz tube 201, the high temperature and gravity will also cause thermocouple sheath 203 to bend downward slowly.

Furthermore, the invention can increase the lifetime of a horizontal quartz tube and save the yearly replacement fee for horizontal quartz tubes significantly. The effort and time spent on replacing horizontal quartz tubes can also be saved. The wafer production rate can thus be improved.

It should be understood that various alternatives to the structures described herein may be employed in practicing the present invention. It is intended that the following claims define the invention and that the structure within the scope of these claims and their equivalents be covered thereby.

What is claimed is:

1. An apparatus for preventing the distortion of horizontal quartz tube due to high temperature and gravity comprising:

a horizontal quartz tube surrounded with a heating element for processing wafers;

an inlet pipe of a gas injector mounted at the center of the closed end of said horizontal quartz tube for injecting high purity gases;

a plurality of sheath supports mounted at the edge of the closed end of said horizontal quartz tube for supporting a thermocouple sheath inserted in said horizontal quartz tube; and said thermocouple sheath with a thermocouple inside for inserting into one of said sheath supports that is located at the bottom of said horizontal quartz tube for temperature measurement.

2. The apparatus of claim 1, wherein there are four sheath supports each being 90 degrees apart.

3. The apparatus of claim 1, wherein each of said sheath supports consists of an inlet pipe connected to a ball joint, and a matching cap.

4. The apparatus of claim 3, wherein one end of said thermocouple sheath is made as a cover with a ball joint which can match said ball joints of said sheath supports and the opposite end of said thermocouple sheath is closed.

5. The apparatus of claim 1, wherein said horizontal quartz tube, said inlet pipe of said gas injector, said sheath supports, and said thermocouple sheath are all made of quartz.

6. A method for preventing the distortion of a horizontal quartz tube due to high temperature, said method comprising:

a. mounting four sheath supports at the edge of the closed end of a horizontal quartz tube;

b. rotating said horizontal quartz tube 90 degrees each time in a predetermined direction; and c. inserting a thermocouple sheath into one of said sheath supports that is located at the bottom of said horizontal quartz tube.

7. The method of claim 6, wherein said step b. further comprising:

removing the pipe connected to the inlet pipe of a gas injector mounted at the center of said closed end of said horizontal quartz tube before rotating said horizontal quartz tube.

8. The method of claim 6, wherein said predetermined direction of said step b. is clockwise.

9. The method of claim 6, wherein said predetermined direction of said step b. is counter-clockwise.

10. The method of claim 6, wherein the separation of each time of rotating said horizontal quartz tube is 14 to 15 days.

11. An apparatus for preventing the distortion of a horizontal quartz tube due to high temperature, said apparatus comprising:

a horizontal quartz tube surrounded with a heating element for processing wafers;

an inlet pipe of a gas injector mounted at the center of the closed end of said horizontal quartz tube for injecting high purity gases;

four sheath supports mounted at the edge of the closed end of said horizontal quartz tube each being 90 degrees apart for allowing a thermocouple sheath to be inserted in said horizontal quartz tube; and said thermocouple sheath with a thermocouple inside for inserted into one of said sheath supports that is located at the bottom of said horizontal quartz tube for temperature measurement.

12. The apparatus of claim 11, wherein each of said sheath supports consists of an inlet pipe connected to a ball joint, and a matching cap.

13. The apparatus of claim 12, wherein one end of said thermocouple sheath is made as a cover with a ball joint which can match said ball joints of said sheath supports and the opposite end of said thermocouple sheath is closed.

14. The apparatus of claim 11, wherein said horizontal quartz tube, said inlet pipe of said gas injector, said sheath supports, and said thermocouple sheath are all made of quartz.

* * * * *

UNITED STATES PATENT AND TRADEMARK OFFICE
CERTIFICATE OF CORRECTION

PATENT NO. : 5,584,934
DATED : December 17, 1996
INVENTOR(S) : Peter Y. Lin

It is certified that error appears in the above-indentified patent and that said Letters Patent is hereby corrected as shown below:

Title page, <u>Item 73</u>, "Taiwan, Taiwan" should read --Taiwan, Republic of China--;

<u>Column 4, line 32</u>, "of" should read --of a--;

<u>Column 6, line 5</u>, "inside for" should read --inside--.

Signed and Sealed this

Twentieth Day of May, 1997

Attest:

BRUCE LEHMAN

*Attesting Officer*    Commissioner of Patents and Trademarks